US007190223B2

(12) United States Patent
Ueno et al.

(10) Patent No.: US 7,190,223 B2

(45) Date of Patent: Mar. 13, 2007

(54) AMPLIFIER

(75) Inventors: Hidekatsu Ueno, Tokyo (JP); Yoshihiro Narita, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 161 days.

(21) Appl. No.: 11/089,135

(22) Filed: Mar. 24, 2005

(65) Prior Publication Data

US 2005/0225387 A1 Oct. 13, 2005

(30) Foreign Application Priority Data

Apr. 7, 2004 (JP) ......................... P. 2004-112862
Feb. 15, 2005 (JP) ......................... P. 2005-037211

(51) Int. Cl.
*H03F 1/00* (2006.01)

(52) U.S. Cl. ....................................... 330/151; 330/149

(58) Field of Classification Search ................ 330/151, 330/149
See application file for complete search history.

(56) References Cited

U.S. PATENT DOCUMENTS 6,744,315 B2 * 6/2004 Ezuka ........................ 330/149
6,756,844 B2 * 6/2004 Nanao et al. ............... 330/149
6,791,410 B2 * 9/2004 Kim et al. .................. 330/151
6,900,693 B2 * 5/2005 Sasho et al. ................ 330/133
7,035,345 B2 * 4/2006 Jeckeln et al. ............. 375/296
7,091,782 B2 * 8/2006 Jacob ......................... 330/151
7,106,134 B2 * 9/2006 Khanifar et al. ............ 330/151

FOREIGN PATENT DOCUMENTS

JP 2003-283259 10/2003

* cited by examiner

*Primary Examiner*—Patricia Nguyen
(74) *Attorney, Agent, or Firm*—Jacobson Holman PLLC

(57) ABSTRACT

There is provided an amplifier that achieves stable distortion compensation without using a pilot signal even when there is a difference in level in the base signal of a multicarrier signal. The amplifier is a feedforward amplifier for amplifying a multifrequency wideband signal without using a pilot signal, and includes an input monitoring section in a signal input stage and an output monitoring section in a signal output stage, whereby for fluctuations in level of the signal from the monitoring sections, when the signal level is decreased to cause a significant decrease in the level of adjacent channel leakage power (ACP) and when the signal level does not decrease to cause a slight increase in ACP level, the controller shifts a set ACP reception frequency to an opposite frequency of the multicarrier signal, thereby achieving stable distortion compensation even when there is a difference in level in the base signal of a multicarrier signal.

10 Claims, 16 Drawing Sheets

AMPLIFIER

BACKGROUND OF THE INVENTION

1. Field of the Invention

The present invention relates to an amplifier, and in particular, it relates to an amplifier that changes the frequency to detect adjacent channel leakage power (ACP) without using a pilot signal when a difference in level between carriers occurs, to compensate for distortion by a stable feedforward (FF) control.

2. Description of the Related Art

Referring to FIG. 12, a general feedforward amplifier (FF amplifier) will be described. FIG. 12 is a block diagram showing the basic structure of a related-art FF amplifier.

As shown in FIG. 12, the related-art amplifier includes a first directional coupler 1, a first vector controller 2, a main amplifier 3 for amplifying an input signal, a second directional coupler 4, a first delay line 5, a second vector controller 6, an auxiliary amplifier 7, a second delay line 8, a third directional coupler 9, a distortion detector 10, a controller 11, a fourth directional coupler 12, a pilot receiver 13, and a pilot signal generator 14.

In the amplifier, a distortion detection loop is constructed of the first directional coupler 1, the first vector controller 2, the main amplifier 3 for amplifying an input signal, the second directional coupler 4, the first delay line 5, the distortion detector 10, and the controller 11; a distortion elimination loop is constructed of the second directional coupler 4, the second vector controller 6, the auxiliary amplifier 7, the second delay line 8, the third directional coupler 9, the controller 11, the fourth directional coupler 12, and the pilot receiver 13.

In the amplifier, the first and second vector controllers 2 and 6 include a variable attenuator and a variable phase shifter and controls the balance of the loops.

Of the inputted signal, the base signal is suppressed to extract only distortion by balancing the distortion detection loop by the operation of the first vector controller 2. The base signal means an inputted signal component.

The distortion detector 10 measures the suppression of the base signal. The first vector controller 2 is controlled automatically by the controller 11 so that the measurement becomes the minimum.

In the path of the second delay line 8, the base signal amplified by the main amplifier 3 has distortion. The pilot signal generator 14 delivers a pilot signal into the distortion detection loop. The pilot receiver 13 receives the pilot signal via the fourth directional coupler 12. The controller 11 controls the second vector controller 6 automatically so that the level of the pilot signal becomes the minimum.

The balance of the two loops is controlled by the two detectors of the distortion detector 10 and the pilot receiver 13, the controller 11, and the first and second vector controllers 2 and 6 in the loops, so that the distortion in the path of the second delay line 8 and extracted distortion are combined in opposite phase by the third directional coupler 9, so that the base signal without distortion is amplified to a specified level at the output (OUT).

FIG. 13 is spectral graph of the input signal and the output signal of the amplifier, respectively. FIG. 13 shows the generation of ACP. In the drawings, frequency is plotted in abscissa and signal level in ordinate. Since the output signal in ordinate is larger than the input signal in ordinate because the output signal is amplified. The dotted line of the output signal is shown in schematic form in assumption that the amplifier amplifies the signal linearly without generating distortion.

When a wideband signal as in wideband code division multiple access (W-CDMA) is amplified, ACP is generated as intermodulation distortion (IM) in the vicinity of the input signal as shown in FIG. 13.

Also with the FF amplifier, the base signal in the output signal of the main amplifier 3 is distorted, as shown in FIG. 13. When the distortion elimination loop is controlled so as to lower the ACP level as in the foregoing method in which the IM (ACP) level in the vicinity of the base signal is received by the pilot receiver 13 and the pilot signal is used, there is no need to use the pilot signal. The structure of an amplifier that uses no pilot signal is shown in FIG. 14. FIG. 14 is a block diagram of an FF amplifier of a frequency-fixed ACP reception system.

There is another related-art distortion compensation amplifiers. FIG. 11 is a block diagram showing the structure of another related-art distortion compensation amplifier.

The distortion compensation amplifier of FIG. 11 includes a distortion compensating circuit 21 that compensates for the distortion of an input signal, a main amplifier 22 that amplifies the inputted signal, a directional coupler 23 that divides the inputted signal, a distortion detector 24 that detects the level of the ACP in the amplified signal, and a controller 25 that controls the compensation of the distortion compensating circuit 21.

The distortion compensation amplifier of FIG. 11 compensates for distortion in such a way that, because IM (ACP) is generated in the output of the main amplifier 22, a feedback loop is constructed in which the controller 25 controls the distortion compensating circuit 21 so that the ACP level detected by the distortion detector 24 is reduced.

Related-art distortion compensation amplifiers include a distortion compensation amplifier published in JP-A-2003-283259, Oct. 3, 2003, (Applicant: Hitachi Kokusai Electric Inc., Inventor: Junya Dosaka).

This related-art distortion compensation amplifier is a feedforward amplifier that uses a pilot signal for a multicarrier.

SUMMARY OF THE INVENTION

Referring to FIG. 15 and FIGS. 16A and 16B, the distortion compensation for the fluctuations in carrier level in an amplifier that uses no pilot signal will be described. FIG. 15 and FIGS. 16A and 16B are explanatory diagrams of the FF action of ACP reception system, wherein FIG. 15 is a spectral graph of one carrier, and FIGS. 16A and 16B are spectral graphs of a multicarrier. In the drawings, frequency is plotted in abscissa and signal level in ordinate.

When the system provides information on the frequency of the base signal, control without a pilot signal can be achieved by combining the ACP reception frequency to the vicinity of the base signal, as shown in FIG. 15.

For one carrier, the ACP reception frequency is fixed to the vicinity of the carrier, and so even when the level of the carrier fluctuates, only ACP level fluctuates. Accordingly, with a low level, the distortion elimination loop requires no large amount of cancel; with a high level, the ACP level is also high, so that the amount of cancel in the distortion elimination loop covers a wide range, providing an accurate cancel amount. This method is good for one carrier.

For a multicarrier, when there is no difference in level among the carriers and at a high level, distortion generated in the carriers by the main amplifier 3 is large as shown by the dotted line in FIG. 16A, so that ACP reception level also becomes high. Thus, a sufficient ACP reception dynamic range can be ensured and also a sufficient cancel amount in the distortion elimination loop can be ensured.

However, with a fixed ACP reception frequency, when there is a difference in level among the carriers: a carrier f3 is on a high level and the other carriers are on a decreased level, as shown in FIG. 16B, also the level of ACP fixed on the side of a carrier f1 is decreased and so the cancel amount of the distortion elimination loop is decreased, posing the problem that the ACP of a carrier f4 may not be cancelled.

There is also a method of switching the ACP reception frequency periodically. This method takes a time for switching. Thus, for a short switching cycle, a high-speed and expensive controller will be disadvantageously required.

An advantage of the present invention is to provide an amplifier that achieves stable distortion compensation without using a pilot signal even if there is a difference in level in the base signal of a multicarrier signal.

According to a first aspect of the invention, there is provided a feedforward amplifier that receives a multicarrier signal. The amplifier includes a distortion detection loop, a distortion compensation loop, a distortion detecting section, a receiver, an input monitoring section, an output monitoring section, and a controller. In the distortion detection loop, an input signal is divided into a first route and a second route, wherein in the first route, the phase and amplitude of the input signal are controlled to be amplified, and in the second route, the input signal is delayed, and the signal from the first route is outputted, and the signals outputted from the first and second routes are combined in opposite phase to cancel the fundamental-wave component signals in the input signals and outputted as a distortion component signal. The distortion compensation loop includes a third route and a fourth route. In the third route, the signal outputted from the first route is delayed. In the fourth route, the phase and amplitude of the distortion component signal are controlled to be amplified, and the signals outputted from the third and fourth routes are combined in opposite phase and outputted as an amplified signal. The distortion detecting section measures the level of the distortion component signal in the fourth route. The receiver measures the signal level of the adjacent channel leakage power from the amplified signal. The input monitoring section monitors the input level of the input signal. The output monitoring section monitors the output level of the output signal. The controller controls the phase and amplitude of the input signal in the distortion detection loop and/or the phase and amplitude of the distortion component signal in the distortion compensation loop based on the signal level detected by the distortion detecting section and the receiver, and shifts the position of a frequency at which adjacent channel leakage power is detected depending on the level of the inputted signal or the outputted signal and the signal level measured by the receiver. This allows stable distortion compensation even when there is a difference in level in the base signal of a multicarrier signal without using a pilot signal.

In this case, preferably, the controller shifts the position of the frequency at which the adjacent channel leakage power is detected to a higher signal level of the receiver in the vicinity of the low frequency or the high frequency of the fundamental-wave component signal depending on the level of the inputted signal or the outputted signal and the signal level measured by the receiver. This allows stable distortion compensation even when there is a difference in level in the base signal of a multicarrier signal.

In this case, preferably, in the case where the position of the frequency at which the adjacent channel leakage power is detected is set in the vicinity of the low frequency of the fundamental-wave component signal, when the level of the fundamental-wave component signal on the low frequency side decreases to decrease the input level in the input monitoring section, and the signal level of the adjacent channel leakage power which has been received by the receiver is decreased, then the controller shifts the position of the frequency at which the adjacent channel leakage power is detected to the vicinity of high frequencies of the fundamental-wave component signal. This allows stable distortion compensation even when there is a difference in level in the base signal of a multicarrier signal.

In this case, preferably, in the case where the position of the frequency at which the adjacent channel leakage power is detected is set in the vicinity of the low frequency of the fundamental-wave component signal, when the level of the fundamental-wave component signal on the high frequency side increases to increase the input level in the input monitoring section, and the signal level of the adjacent channel leakage power which has been received by the receiver does not change very much, then the controller shifts the position of the frequency at which the adjacent channel leakage power is detected to the vicinity of high frequencies of the fundamental-wave component signal. This allows stable distortion compensation even when there is a difference in level in the base signal of a multicarrier signal.

In this case, preferably, the controller retains the signal level of the adjacent channel leakage power in memory and, as a result of shifting the position of the frequency at which the adjacent channel leakage power is detected, compares the signal level of the adjacent channel leakage power after shifting with the signal level of the adjacent channel leakage power before shifting, wherein when the signal level is not increased by a specified amount or more, the controller returns the position of the frequency at which the adjacent channel leakage power is detected to the initial position. Accordingly, only when the ACP level is out of balance between the low frequency and the high frequency sides, the ACP reception frequency is shifted to allow stable FF control.

In this case, preferably, in the case where the position of the frequency at which the adjacent channel leakage power is detected is set in the vicinity of the low frequency of the fundamental-wave component signal, when the level of the fundamental-wave component signal on the high frequency side decreases to decrease the input level in the input monitoring section, and the signal level of the adjacent channel leakage power which has been received by the receiver does not change very much, then the controller does not shift the position of the frequency at which the adjacent channel leakage power is detected to keep the position in the vicinity of low frequencies of the fundamental-wave component signal. This allows stable distortion compensation even when there is a difference in level in the base signal of a multicarrier signal.

In this case, preferably, in the case where the position of the frequency at which the adjacent channel leakage power is detected is set in the vicinity of the low frequency of the fundamental-wave component signal, when the level of the fundamental-wave component signal on the low frequency side increases to increase the input level in the input monitoring section, and the signal level of the adjacent channel leakage power which has been received by the receiver is increased, then the controller does not shift the position of the frequency at which the adjacent channel leakage power is detected to maintain the position in the vicinity of low frequencies of the fundamental-wave component signal. This allows stable distortion compensation even when there is a difference in level in the base signal of a multicarrier signal.

According to a second aspect of the invention, there is provided a feedforward amplifier that receives a multicarrier signal. The amplifier includes a distortion detection loop, a distortion compensation loop, a distortion detecting section, a receiver, an input monitoring section, an output monitoring section, and a controller. In the distortion detection loop, an input signal is divided into a first route and a second route, wherein in the first route, the phase and amplitude of the input signal are controlled to be amplified, and in the second route, the input signal is delayed, and the signal from the first route is outputted, and the signals outputted from the first and second routes are combined in opposite phase to cancel the fundamental-wave component signals in the input signals and outputted as a distortion component signal. The distortion compensation loop includes a third route and a fourth route. In the third route, the signal outputted from the first route is delayed. In the fourth route, the phase and amplitude of the distortion component signal are controlled to be amplified, and the signals outputted from the third and fourth routes are combined in opposite phase and outputted as an amplified signal. The distortion detecting section measures the level of the distortion component signal in the fourth route. The receiver measures the signal level of the adjacent channel leakage power from the amplified signal. The input monitoring section monitors the input level of the input signal. The output monitoring section monitors the output level of the output signal. The controller controls the phase and amplitude of the input signal in the distortion detection loop and/or the phase and amplitude of the distortion component signal in the distortion compensation loop based on the signal level detected by the distortion detecting section and the receiver, retains the signal level of adjacent channel leakage power in memory, shifts the position of a frequency at which the adjacent channel leakage power is detected at specified intervals, and as a result of the shifting, compares the signal level of the adjacent channel leakage power after shifting with the signal level of the adjacent channel leakage power before shifting, wherein when the signal level is increased by a specified amount or more, maintains the position of the frequency at which the adjacent channel leakage power is detected. This allows stable distortion compensation even when there is a difference in level in the base signal of a multicarrier signal without using the pilot signal. Furthermore, only when the ACP level is out of balance between the low frequency and the high frequency sides, the ACP reception frequency is shifted to allow stable FF control.

In this case, preferably, the controller sets a threshold of the level of the distortion component signal detected by the distortion detecting section at a level lower than a detection level required by the product specifications and retains the value in memory, and shifts a control value for controlling the phase and amplitude of the input signal in the distortion detection loop from a control starting position to the optimum value by perturbation, wherein when the detection level in the distortion detecting section becomes lower than the threshold, the controller stops the perturbation control. Thus, control that is more than necessary is not performed and as such, the ACP is prevented from becoming unstable and so stable distortion compensation can be achieved.

In this case, preferably, the controller sets a threshold of the signal level of the adjacent channel leakage power detected by the receiver at a level lower than a detection level required by the product specifications and retains the value in memory, and shifts a control value for controlling the phase and amplitude of the distortion component signal in the distortion compensation loop from a control starting position to the optimum value by perturbation, wherein when the detection level in the receiver becomes lower than the threshold, the controller stops the perturbation control. Thus, control that is more than necessary is not performed and as such, the ACP is prevented from becoming unstable and so stable distortion compensation can be achieved.

DESCRIPTION OF REFERENCE NUMERALS

1 . . . FIRST DIRECTIONAL COUPLER, 2 . . . FIRST VECTOR CONTROLLER, 3 . . . MAIN AMPLIFIER, 4 . . . SECOND DIRECTIONAL COUPLER, 5 . . . FIRST DELAY LINE, 6 . . . SECOND VECTOR CONTROLLER, 7 . . . AUXILIARY AMPLIFIER, 8 . . . SECOND DELAY LINE, 9 . . . THIRD DIRECTIONAL COUPLER, 10 . . . DISTORTION DETECTOR, 11,11': CONTROLLER, 12 . . . FOURTH DIRECTIONAL COUPLER, 13' . . . RECEIVER, 14 . . . PILOT SIGNAL GENERATOR, 15 . . . INPUT MONITORING SECTION, 16 . . . OUTPUT MONITORING SECTION

DESCRIPTION OF THE PREFERRED EMBODIMENTS

The present invention is described in detail below based on embodiments, with reference to the attached drawings.

The amplifier according to embodiments of the invention is a feedforward (FF) amplifier for amplifying a multifrequency wideband signal without using a pilot signal. The amplifier has an input monitoring section in a signal input stage or an output monitoring section in a signal output stage, wherein for the level fluctuation of the signals from the monitoring section, when signal level decreases to cause a significant decrease in the level of adjacent channel leakage power (ACP), and when the signal level does not decrease to increase the ACP level little, the amplifier shifts a set ACP reception frequency to an opposite frequency of a multicarrier. Thus, stable distortion compensation can be achieved even if there is a difference in level in the base signal in a multicarrier signal.

An amplifier according to an embodiment of the invention is a feedforward (FF) amplifier for amplifying a multifrequency wideband signal of the modulated wave of wideband code division multiple access (W-CDMA) in which distortion is compensated by controlling distortion loop(s) without using a pilot signal.

An amplifier according to an embodiment of the invention is a distortion compensation amplifier that controls distortion loop (s) by receiving adjacent channel leakage power (ACP) of a wideband signal.

An amplifier according to an embodiment of the invention is a distortion compensation amplifier that controls distortion loop(s) in such a way that when there are fluctuations in carrier level, it monitors input level and/or output level at the same time, wherein when there are fluctuations in the level, the ACP reception frequency is changed.

Figure 1:
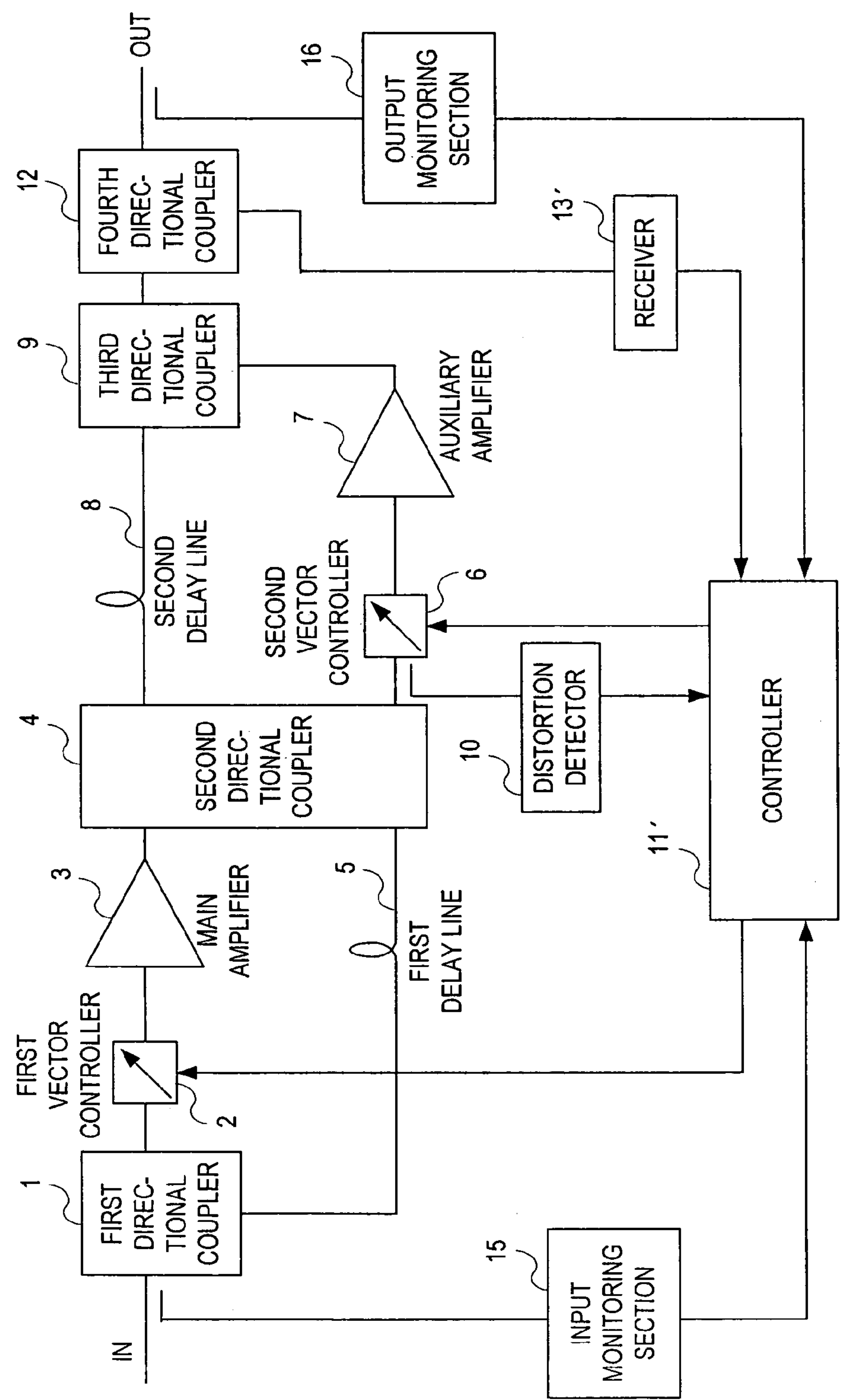
FIG. 1 is a block diagram of an amplifier (a first amplifier) according to a first embodiment of the present invention.
Figure 12:
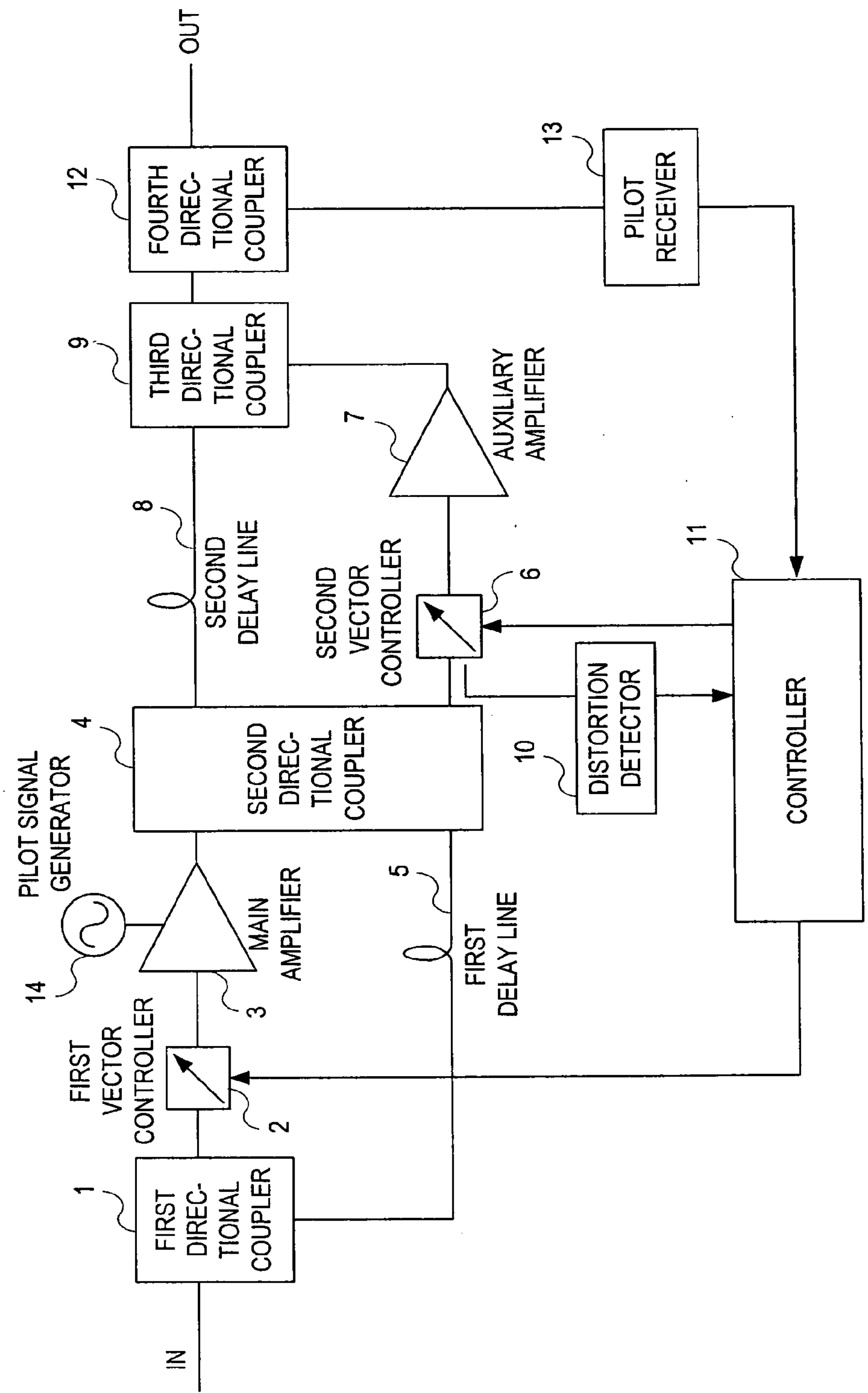
FIG. 12 is a block diagram showing the basic structure of a related-art FF amplifier.
Figure 13:
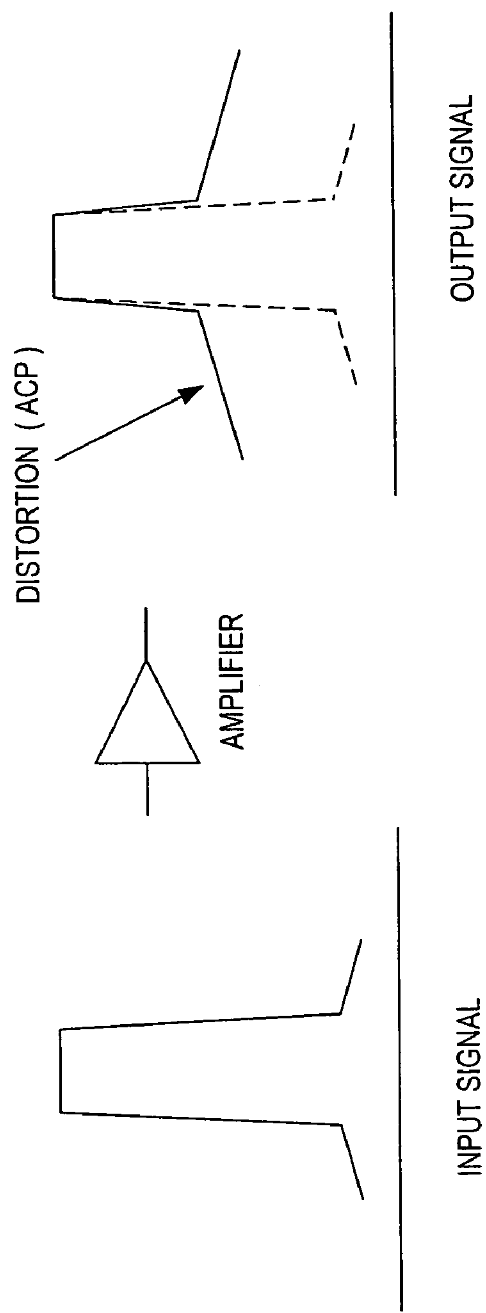
FIG. 13 is spectral graphs showing the generation of ACP.
Figure 14:
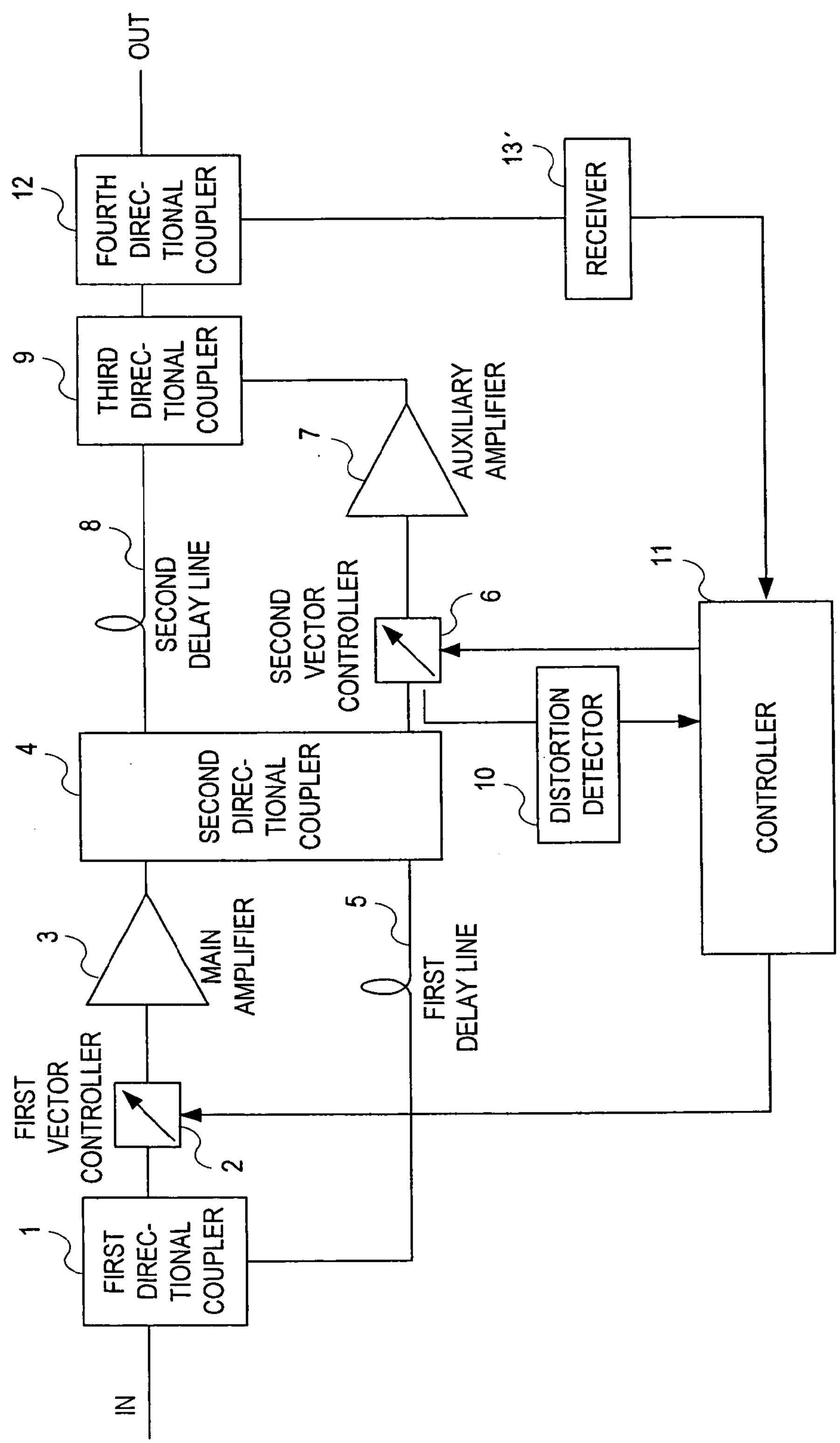
FIG. 14 is a block diagram of an FF amplifier of a frequency-fixed ACP reception system.
Figure 15:
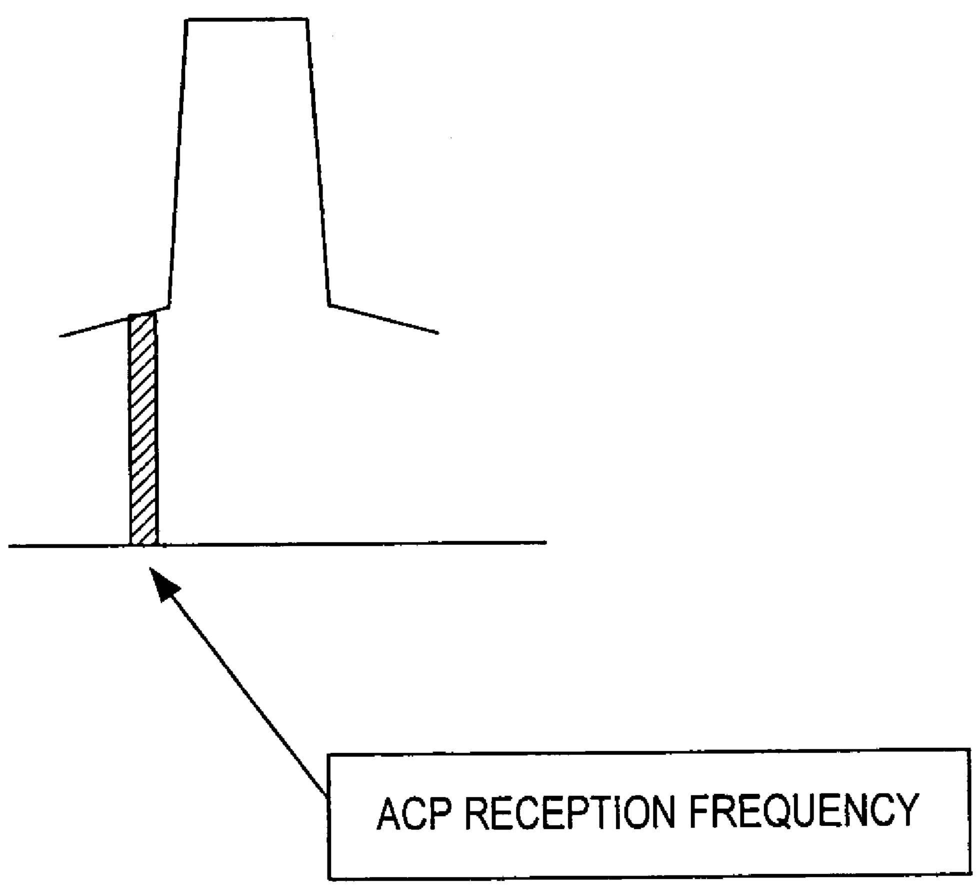
FIG. 15 is a spectral graph of one carrier.
Figure 16:
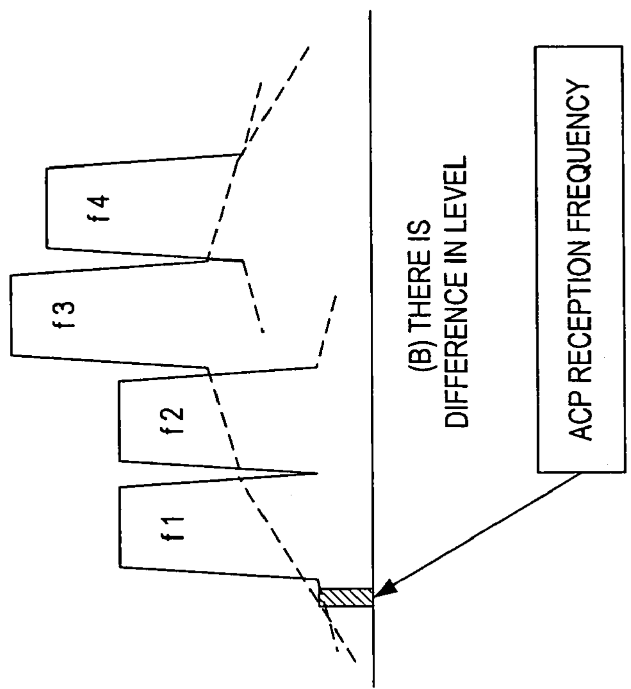
FIGS. 16A and 16B are spectral graphs of a multicarrier.
Figure 16:
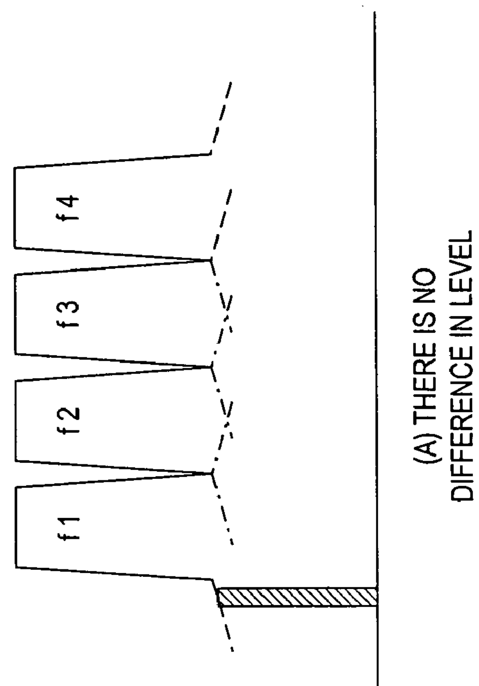

An amplifier according to a first embodiment of the invention will be described with reference to FIG. 1. FIG. 1 is a block diagram of the amplifier (first amplifier, hereinafter, referred to as the amplifier) according to the first embodiment of the present invention. Components with the same structure as that of FIGS. 12 and 14 are given the same reference numerals.

As shown in FIG. 1, the first amplifier (the amplifier) according to the first embodiment of the invention includes a first directional coupler 1, a first vector controller 2, a main amplifier 3, a second directional coupler 4, a first delay line 5, a second vector controller 6, an auxiliary amplifier 7, a second delay line 8, a third directional coupler 9, a distortion detector 10, a controller 11', a fourth directional coupler 12, a receiver 13', an input monitoring section 15, and an output monitoring section 16.

The components of the amplifier will be specifically described.

The first directional coupler 1 divides an input signal and outputs them to the first vector controller 2 and the first delay line 5.

The first vector controller 2 controls the phase and amplitude of the input signal outputted from the first directional coupler 1 and outputs the controlled signal to the main amplifier 3. The first vector controller 2 also changes the control amount of the phase and amplitude of the input signal according to a control signal outputted from the controller 11'. The first vector controller 2 can be achieved by a variable phase shifter or a variable attenuator.

The main amplifier 3 amplifies the input signal outputted from the first vector controller 2 and outputs it to the second directional coupler 4. The difference from the main amplifier of FIG. 12 is that it amplifies the signal without using a pilot signal.

The second directional coupler 4 outputs the input signal amplified by the main amplifier 3 to the second delay line 8, combines the input signal amplified by the main amplifier 3 and the input signal outputted from the first delay line 5 in opposite phase, and outputs the resultant signal to the second vector controller 6 as a distortion component signal.

The first delay line 5 delays the input signal outputted from the first directional coupler 1 and outputs it to the second directional coupler 4. The first delay line 5 is provided to tune to the delayed signal by the amplification of the main amplifier 3.

The second vector controller 6 controls the phase and amplitude of the distortion component signal outputted from the second directional coupler 4 and outputs the controlled input signal to the auxiliary amplifier 7. The second vector controller 6 changes the control amount of the phase and amplitude of the input signal according to the control signal outputted from the controller 11'. The second vector controller 6 can be achieved by a variable phase shifter or a variable attenuator.

The auxiliary amplifier 7 amplifies the distortion component signal outputted from the second vector controller 6 and outputs it to the third directional coupler 9.

The second delay line 8 delays the input signal outputted from the second directional coupler 4 and outputs it to the third directional coupler 9. The second delay line 8 is provided to tune to the delayed distortion component signal by the amplification of the auxiliary amplifier 7.

The third directional coupler 9 combines the input signal outputted from the second delay line 8 and the distortion component signal amplified by the auxiliary amplifier 7 in opposite phase and outputs the resultant signal as an amplified signal.

The distortion detector 10 measures the level of the distortion component signal outputted from the second directional coupler 4 and outputs the measurement to the controller 11'.

The controller 11' determines the control amount of the phase and amplitude in the first vector controller 2 depending on the level of the distortion component signal, measured by the distortion detector 10, and outputs a control signal indicative of change to the control amount to the first vector controller 2.

The controller 11' also determines the control amount of the phase and amplitude in the second vector controller 6 depending on the reception level of the ACP signal detected by the receiver 13' and outputs a control signal indicative of change to the control amount to the second vector controller 6.

The controller 11' may also determine the control amount in the first and second vector controllers 2 and 6 depending on both levels measured by the distortion detector 10 and the receiver 13'.

The controller 11' inputs the result of monitoring by the input monitoring section 15 and the result of monitoring by the output monitoring section 16, and the ACP reception level (ACP level) by the receiver 13', retains the values of the levels in memory, and controls depending on the signal level whether to shift the set position for the ACP reception frequency to the low frequency or high frequency side of the multicarrier or not to shift. The specific shift control for the set position for the ACP reception frequency by the controller 11' will be described later.

The fourth directional coupler 12 divides an amplified signal outputted from the third directional coupler 9 and outputs them to an output terminal (OUT) and to the receiver 13'.

The receiver 13' receives a signal (ACP signal) with a frequency set by the controller 11' of the amplified signal outputted from the fourth directional coupler 12, measures the reception level of the ACP signal, and outputs the measurement to the controller 11' as an ACP level.

The input monitoring section 15 monitors the input level and outputs the result of monitoring to the controller 11'.

The output monitoring section 16 monitors the output level and outputs the result of monitoring to the controller 11'.

Figure 2:
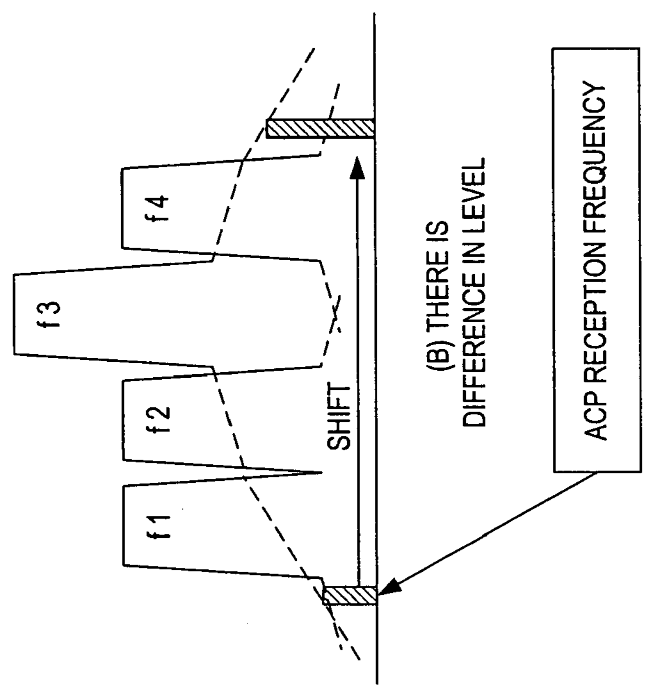
FIGS. 2A and 2B are schematic graphs of spectrums according to the embodiment.
Figure 2:
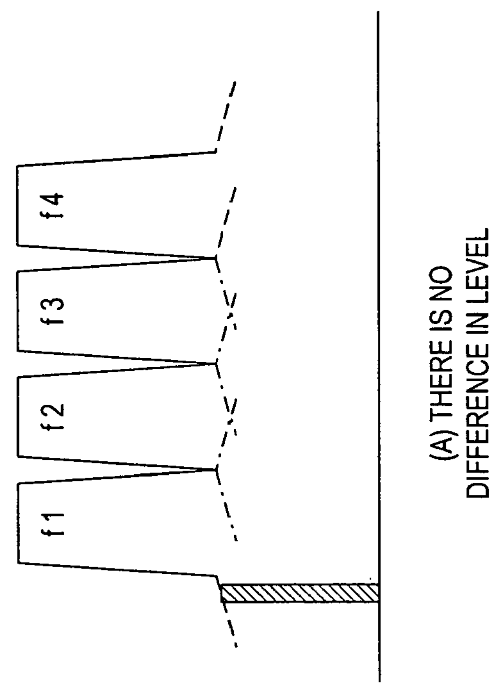

Referring to FIGS. 2A and 2B, distortion compensation for the fluctuations in carrier level in this amplifier will be described. FIGS. 2A and 2B are schematic graphs of spectrums according to the embodiment.

As shown in FIG. 2A, the controller 11' of the amplifier sets the ACP reception frequency in the vicinity of the low frequency or the high frequency side of the multicarrier. In general, the arrangement of the carries is fixed in the system at all times or information on frequency is provided from the system, so that, the ACP reception frequency is set by using the information.

One of the features of the amplifier is that the controller 11' prepares ACP reception frequencies in the vicinity of the low frequency and the high frequency sides of the multicarrier depending on the given frequency of the multicarrier, and sets one of the low frequency and the high frequency of the multicarrier in the receiver 13' as ACP reception frequency.

When the ACP reception frequency cannot be determined by the information from the system, the controller 11' may control the receiver 13' so as to scan the ACP reception frequency in sequence, thereby determining the ACP reception frequency one at a time directly outside a frequency at which the level of reception from the receiver 13' varies significantly (in the vicinity of the low frequency or the high frequency side of the multicarrier).

For the receiver 13', the high frequency or low frequency may be set as the default of the ACP reception frequency in advance. FIG. 2A shows an example in which the ACP reception frequency is set on the low frequency side of the multicarrier. The receiver 13' receives the signal of the ACP reception frequency set by the controller 11' and determines the ACP level.

The intermodulation distortion (IM) characteristic of the main amplifier 3 is that when the output of the main amplifier 3 fluctuates, the IM amount (ACP level) fluctuates more than that. Accordingly, as shown in FIG. 2B, the controller 11' of the amplifier shifts the ACP reception frequency from the low frequency side of the multicarrier to the high frequency side or from the high frequency side to the low frequency side by using the IM-generation characteristic of the main amplifier 3 to perform distortion compensation according to a more appropriate ACP signal.

More specifically, the controller 11' controls the ACP reception frequency for the receiver 13' on the basis of the fluctuation in the input level from the input monitoring section 15 or the output level from the output monitoring section 16 and the fluctuation in the ACP level.

The operation of the amplifier will be described with reference to the following four examples (Examples 1 to 4).

In Example 1, in the case where the ACP reception frequency is set in the vicinity of the low frequency side carrier, when the carrier level on the low frequency side decreases and so the input level of the input monitoring section 15 is decreased, the ACP level that has been received till then is further decreased. At that time, the controller 11' shifts the ACP reception frequency to the high frequency side and sets the ACP reception frequency on the high frequency side for the receiver 13'.

In Example 2, in the case where the ACP reception frequency is set in the vicinity of the low frequency side carrier, when the carrier level on the high frequency side decreases, and so the input level of the input monitoring section 15 is decreased, but the ACP level on the low frequency side does not fluctuates so much. In this case, the controller 11' does not shift the ACP reception frequency because sufficient distortion compensation can be provided by the ACP reception frequency that is set at present.

In Example 3, in the case where the ACP reception frequency is set in the vicinity of the low frequency side carrier, when the carrier level on the low frequency side increases, and so the input level of the input monitoring section 15 is increased and the ACP level that has been received till then is further increased. At that time, the controller 11' does not shift the ACP reception frequency.

In Example 4, in the case where the ACP reception frequency is set in the vicinity of the low frequency side carrier, when the carrier level on the high frequency side increases, the input level of the input monitoring section 15 is increased but the ACP level on the low frequency side does not fluctuates so much. In this case, the controller 11' shifts the ACP reception frequency to the high frequency side because sufficient distortion compensation may not be provided.

Fluctuations in carrier level (the input level and the output level) and fluctuations in ACP level corresponding thereto which are conditions to shift the ACP reception frequency are stored in the controller 11' as threshold in advance. The controller 11' compares the fluctuation in ACP level with the threshold of the fluctuation in ACP level corresponding to the carrier level and determines whether to shift the ACP reception frequency, thereby performing the control.

The fluctuation in the level of the base signal may be set for the number of carriers. For example, for four carriers, when carriers except one carrier fluctuates, the fluctuation in the level of the base signal is set large and the ACP reception frequency is shifted. When only one carrier fluctuates, the level fluctuation of the base signal is set small and when the ACP level depends heavily on the remaining carriers that has no fluctuation, the ACP reception frequency is not shifted.

Figure 3:
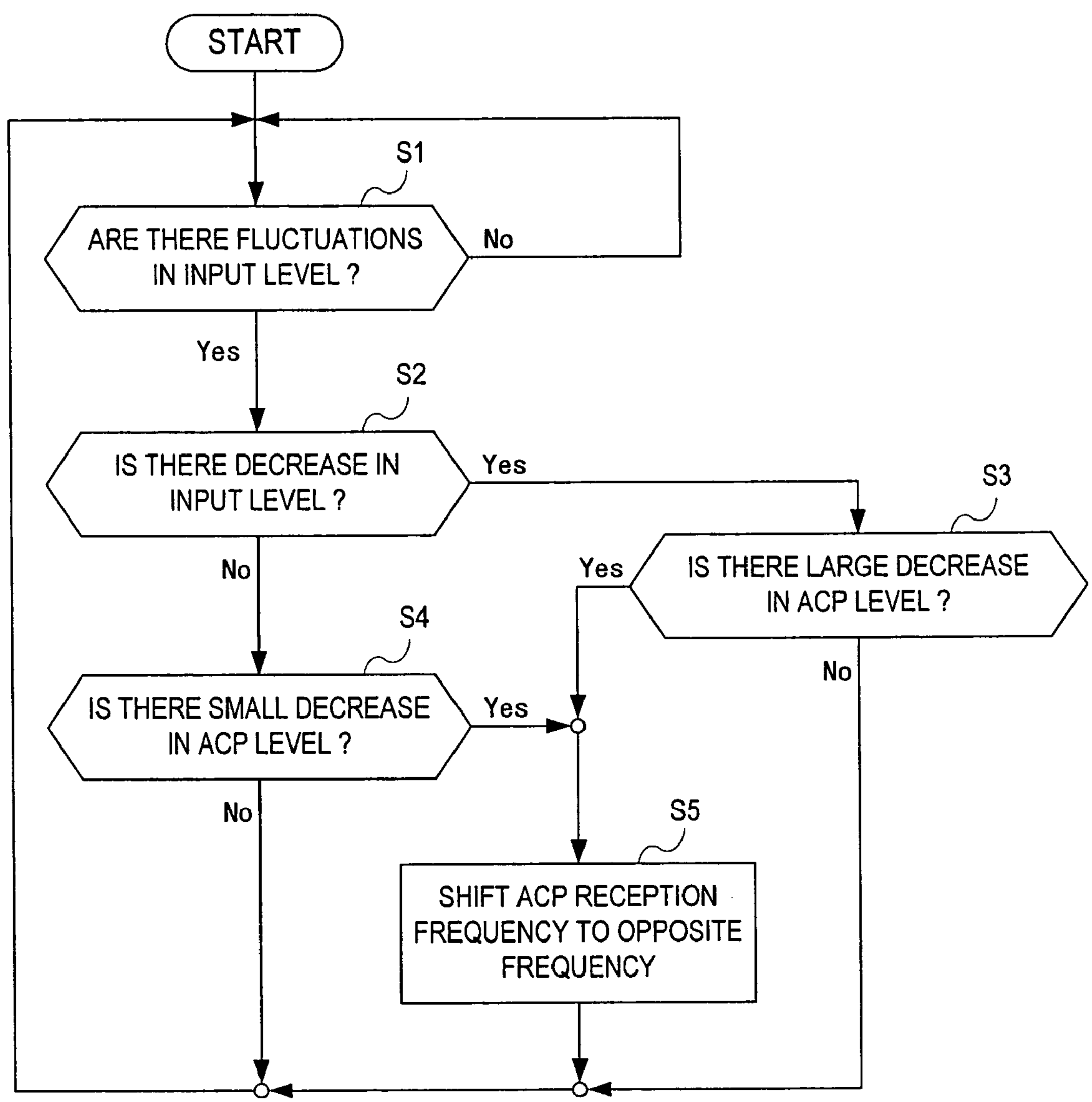
FIG. 3 is a flowchart for the process of the controller of the amplifier according to the embodiment.

The operation of the amplifier will then be described with reference to FIG. 3. FIG. 3 is a flowchart for the process of the controller of the amplifier according to the embodiment of the invention. In FIG. 3, the ACP reception frequency is set on the low frequency side of the multicarrier.

As shown in FIG. 3, the controller 11' monitors the result of monitoring by the input monitoring section 15 to determine whether there is a fluctuation in input level (S1). When there is a fluctuation in input level (Yes), the controller 11' determines whether there is a decrease in input level (S2).

When it is determined in the determination process S2 that there is a decrease in input level (Yes), then it is determined whether there is a large decrease in ACP level (S3). In the determination process S3, it is determined that the decrease in ACP level is not large or the ACP level is not decreased by more than a specified amount (No), which means that the decrease in carrier level on the side of the set ACP reception frequency is small even if the input level of the entire carrier is decreased. Accordingly, the ACP reception frequency is not shifted and the process is terminated.

On the other hand, when it is determined in the determination process S2 that there is no decrease in input level (No), then it is determined whether there is a small decrease in ACP level (S4). In the determination process S4, it is determined that the increase in ACP level is not small or the ACP level is increased by more than a specified amount (No), the ACP reception frequency is not shifted and the process is terminated.

On the other hand, when it is determined in the determination process S4 that the increase in ACP level is small or the ACP level is not increased by more than a specified amount (Yes), which means that the increase in carrier level on the side of the set ACP reception frequency is small even if the input level of the entire carrier is increased. Accordingly, it is estimated that the carrier level on the opposite side is increased. Thus, the ACP reception frequency is shifted to the opposite frequency (S5), and the process is terminated.

While the level fluctuation of the base signal has been described with reference to the input level from the input monitoring section 15, it may be described with reference to the output level from the output monitoring section 16 in FIG. 1.

The output monitoring section 16 may be disposed downstream or upstream of the fourth directional coupler 12.

The operation of the amplifier for the multicarrier input signal will now be described.

The multicarrier input signal is inputted to the first directional coupler 1, is divided by the first directional coupler 1, and is outputted to the first vector controller 2 and the first delay line 5. The input signal inputted to the first vector controller 2 is controlled in phase and amplitude and is further amplified by the main amplifier 3, and is then outputted to the second directional coupler 4. The input signal inputted to the first delay line 5 is delayed and then outputted to the second directional coupler 4.

In the second directional coupler 4, the input signal amplified by the main amplifier 3 is outputted to the second delay line 8, and the input signal amplified by the main amplifier 3 and the input signal delayed by the first delay line 5 are combined in opposite phase, so that the fundamental wave components in the input signals are cancelled, and the resultant distortion component signal is outputted to the second vector controller 6.

The distortion level of the distortion component signal outputted from the second directional coupler 4 is measured by the distortion detector 10 and the measured distortion level is inputted to the controller 11'. The controller 11' controls the phase and amplitude of the input signal by the first vector controller 2 depending on the level of the distortion component signal inputted to the controller 11'.

The distortion component signal inputted to the second vector controller 6 is controlled in phase and amplitude and is amplified by the auxiliary amplifier 7. The input signal delayed by the second delay line 8 and the distortion component signal amplified by the auxiliary amplifier 7 are combined in opposite phase by the third directional coupler 9, so that the distortion component is cancelled, and the resultant amplified signal having only the fundamental wave component in the input signal is outputted to the fourth directional coupler 12.

The signal inputted to the fourth directional coupler 12 is divided, one of which is outputted to the output terminal (OUT) and the other is inputted to the receiver 13'. The level of the signal inputted to the receiver 13' is measured and outputted to the controller 11'. The controller 11' controls the phase and amplitude of the input signal by the second vector controller 6 depending on the level inputted to the controller 11'.

The controller 11' uses the set ACP reception frequency as the reference to determine the cancel amount in the distortion elimination loop, in which it is controlled whether to shift the ACP reception frequency to the low frequency side of the multicarrier or to the high frequency side, or it is not shifted.

With this amplifier, the ACP reception frequency is shifted on the basis of a fluctuation in the input or output level of the base signal and a fluctuation in ACP level in accordance with the characteristics of the main amplifier 3. Accordingly, even if a difference in level occurs between the carriers in the base signal of a multicarrier signal, stable FF control can be achieved.

Also, since the amplifier is constructed of only the ACP receiving circuit, a pilot transmitting circuit can be omitted and as such, there is no need to control the pilot signal. This allows a reduction in the number of parts and control processes, providing a low-price FF amplifier.

Also, since the amplifier does not switch the frequency periodically, it needs no high-speed processing capability, thus the controller can be inexpensive.

An amplifier according to a second embodiment of the invention will be described below.

The structure of the amplifier (second amplifier) according to the second embodiment is substantially the same as the amplifier (first amplifier) according to the first embodiment shown in FIG. 1. Accordingly, a description thereof will be omitted here, but there is no need to have the input monitoring section 15 and the output monitoring section 16. The description will be made by using the reference numerals in FIG. 1. However, the process of shifting the ACP reception frequency in the controller 11' of the second amplifier is different in part from that of the first amplifier.

In the second amplifier, when distortion compensation is performed by using an ACP reception frequency that is set in the vicinity of the low frequency side or a high frequency side of the multicarrier as the default, the ACP reception frequency is temporarily shifted to an opposite frequency at specified intervals (periodically), where a fluctuation in ACP level is checked, wherein only when it is increased by a specified amount or more, the default of the ACP reception frequency in the receiver 13' is changed to the opposite frequency. The default frequency in the second amplifier means a frequency set as an ACP reception frequency in the receiver 13'.

Figure 4:
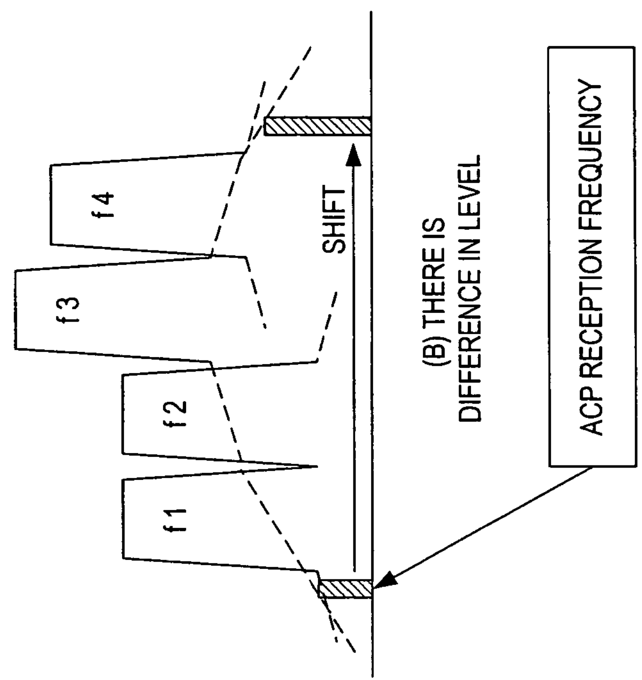
FIGS. 4A and 4B are graphs showing the control of the shift of an ACP reception frequency in a second amplifier.
Figure 4:
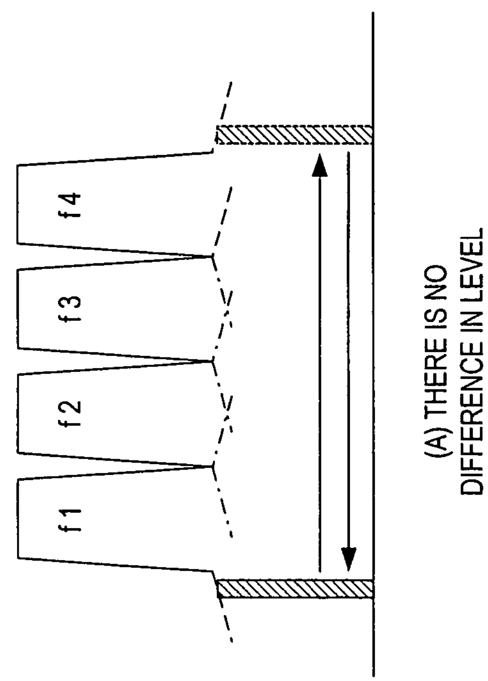

The features of the second amplifier will be described with reference to FIGS. 4A and 4B. FIGS. 4A and 4B are graphs showing the shift control of the ACP reception frequency in the second amplifier.

As shown in FIGS. 4A and 4B, when the low frequency side of the base signal of the multicarrier is set as the default ACP reception frequency, the controller 11', which generally performs distortion compensation at low frequencies, temporarily shifts the ACP reception frequency to high frequencies at specified intervals, where it compares the ACP levels before and after the shift, which are sent from the receiver 13'. Like the first amplifier, the controller 11' of the second amplifier retains the ACP level inputted from the receiver 13' in memory.

As shown in FIG. 4A, when there is no difference more than a specified amount between the ACP levels before and after shifting, the controller 11' returns the ACP reception frequency to the low frequency side, and does not control the ACP reception frequency for the receiver 13', keeping the frequency on the low frequency side at the default.

As shown in FIG. 4B, when the ACP level after shifting becomes a specified amount larger than that before shifting, as in fluctuations in carrier level, the controller 11' sets the high frequency after shifting as the default of the ACP reception frequency in the receiver 13' and performs distortion compensation by using the high frequency.

Figure 5:
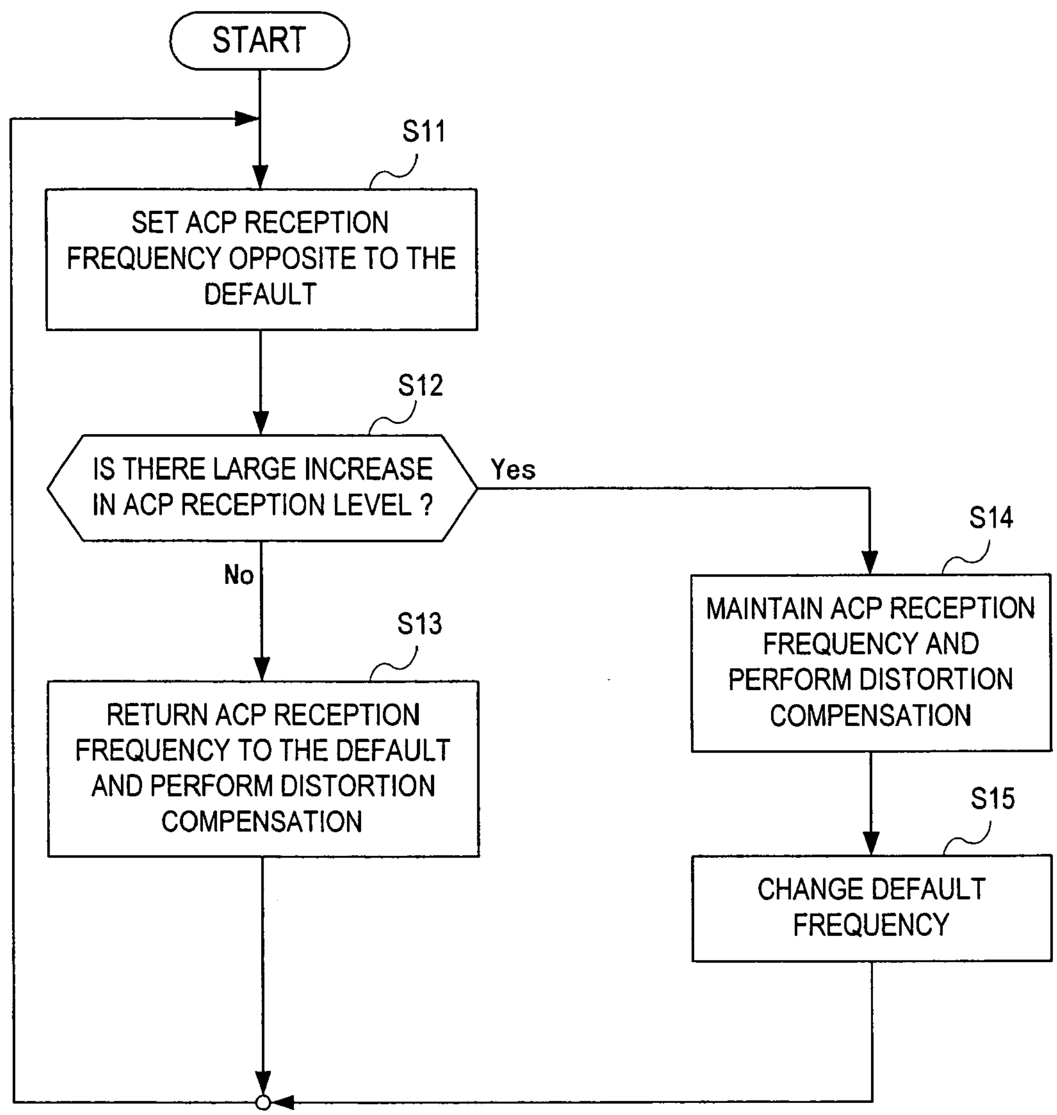
FIG. 5 is a flowchart showing the control of the ACP reception frequency by a controller of the second amplifier.

The process of the controller 11' of the second amplifier will be described with reference to FIG. 5. FIG. 5 is a flowchart showing the control of the ACP reception frequency of the controller 11' of the second amplifier.

As shown in FIG. 5, the controller 11' of the second amplifier periodically outputs an instruction to set the ACP reception frequency opposite to the default to the receiver 13' (S11).

The ACP level inputted from the receiver 13' is compared with the ACP level before shifting to determine the increase (S12).

When it is determined in the determination process S12 that the increase in ACP level is not large, or the ACP level is decreased or is not increased by a specified amount or more (No), the controller 11' returns the ACP reception frequency of the receiver 13' to the frequency before shifting and performs distortion compensation (S13).

On the other hand, when it is determined in the determination process S12 that the increase in ACP level is great, or the ACP level is increased by a specified amount or more (Yes), the controller 11' maintains the ACP reception frequency of the receiver 13' (the frequency after shifting), performs distortion compensation (S14), and changes the default of the ACP reception frequency to the frequency after shifting and set it for the receiver 13' (S15). Thus, the ACP reception frequency is set in the second amplifier.

With the amplifier according to the second embodiment of the invention, the ACP reception frequency is temporarily shifted to the opposite side at regular time intervals, where the fluctuation is checked, wherein when there is a large difference in ACP level between the ACP reception frequency on the low frequency side of the multicarrier and that on the high frequency side, a frequency with high ACP level is set for the receiver 13' as the ACP reception frequency. Thus, only when the ACP level is out of balance between the low frequency side and the high frequency side, the ACP reception frequency is shifted, thus allowing stable FF control.

An amplifier according to a third embodiment of the invention will be described below.

The structure of the amplifier (third amplifier) according to the third embodiment is substantially the same as the amplifier (first amplifier) according to the first embodiment shown in FIG. 1. Accordingly, the description will be made by using the reference numerals in FIG. 1. However, the process of shifting the ACP reception frequency in the controller 11' of the third amplifier is different in part from those of the first and second amplifiers.

In the above-mentioned second amplifier, the ACP reception frequency is temporarily shifted at regular time intervals, where the fluctuation is checked. In the third amplifier, however, the ACP reception frequency is shifted on the basis of the fluctuation in input level or output level of the base signal and the fluctuation in ACP level, as in the first amplifier. Furthermore, when there is no specified amount or more of increase in ACP level in comparison between the ACP level after shifting and that before shifting, the ACP reception frequency is returned to the initial frequency. The controller 11' of the third amplifier retains the ACP level inputted from the receiver 13' in memory, as in the first and second amplifiers.

Figure 6:
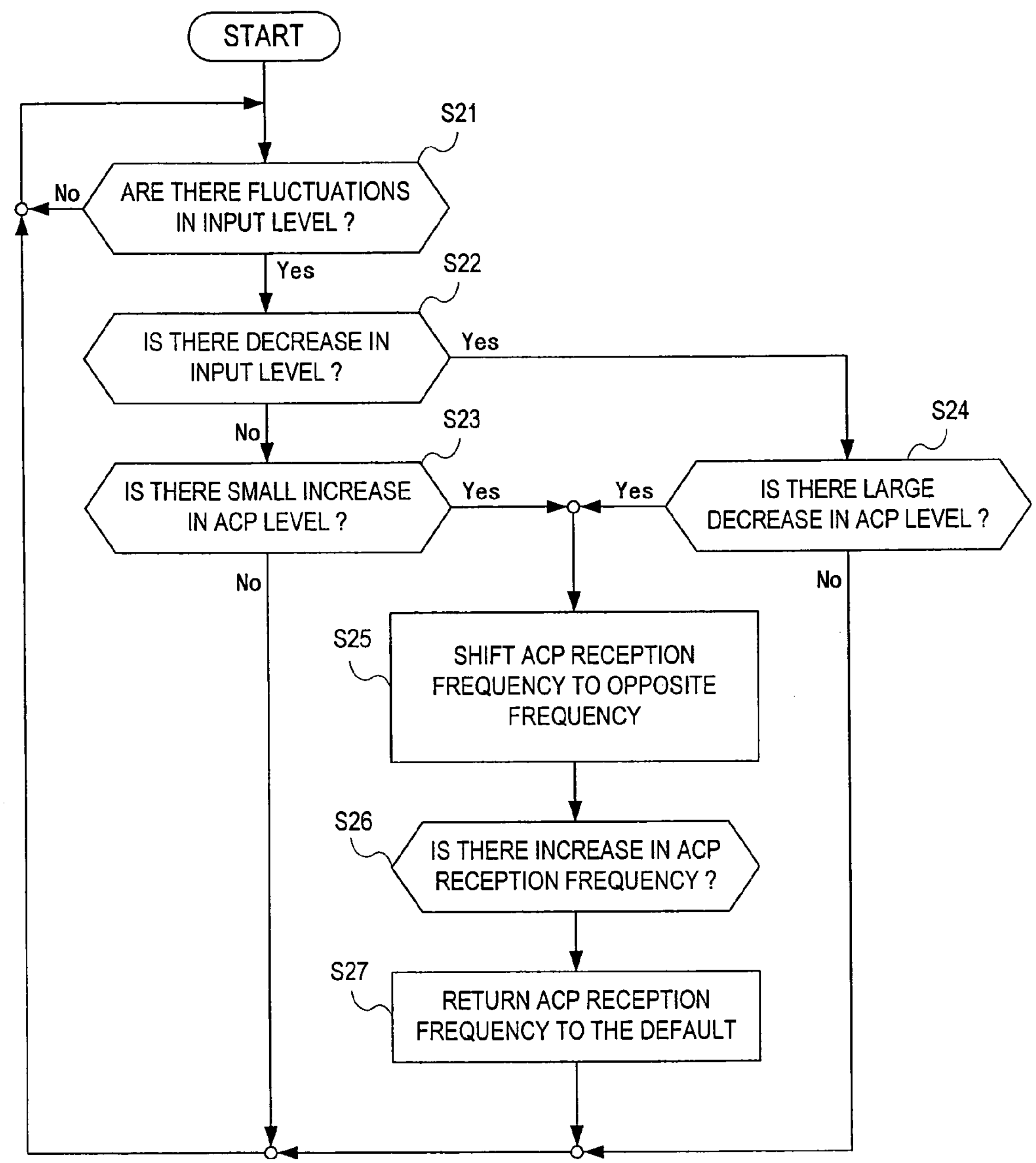
FIG. 6 is a flowchart showing the control of the ACP reception frequency by a controller of a third amplifier.

Referring to FIG. 6, the process of shifting the ACP reception frequency by the controller 11' of the third amplifier will be described. FIG. 6 is a flowchart showing the control of the ACP reception frequency of the controller 11' of the third amplifier.

Since the process of S21 to S25 in FIG. 6 is the same as that of S1 to S5 in the controller 11' of the first amplifier shown in FIG. 3, its description will be omitted.

As shown in S21 to S25 of FIG. 6, the controller 11' of the third amplifier shifts the set ACP reception frequency to the opposite frequency of the multicarrier on the basis of the fluctuation in input level from the input monitoring section 15 and the fluctuation in ACP level (S25), checks the ACP level from the receiver 13' to determine whether the ACP level after shifting is increased by a specified amount ore more as compared with the stored ACP level before shifting, as in the process of the first amplifier.

When it is determined in the determination process S21 that the ACP level after shifting becomes higher than that before shifting by a specified amount or more (Yes), the controller 11' returns to the process S21 and repeats the control process, with the ACP reception frequency left at the frequency after shifting.

On the other hand, when it is determined in the determination process S21 that the ACP level after shifting is not increased from that before shifting by a specified amount or more, or the ACP level after shifting is decreased, equal, or increased only slightly, the ACP reception frequency is returned to the frequency before shifting and set for the receiver 13' (S27).

Thus the process of the third amplifier is executed. The process of FIG. 6 uses the input level from the input monitoring section 15; it may use the output level from the output monitoring section 16.

With the amplifier according to the third embodiment of the invention, the ACP reception frequency is shifted to the opposite side on the basis of the fluctuation in input level or output level of the base signal and the fluctuation in ACP level. Accordingly, even if there is a difference in level between the carries in the base signal of a multicarrier signal, stable FF control can be achieved.

With the third amplifier, the ACP reception frequency is shifted only when the ACP level is out of balance between the low frequency side and the high frequency side, allowing stable FF control.

Figure 11:
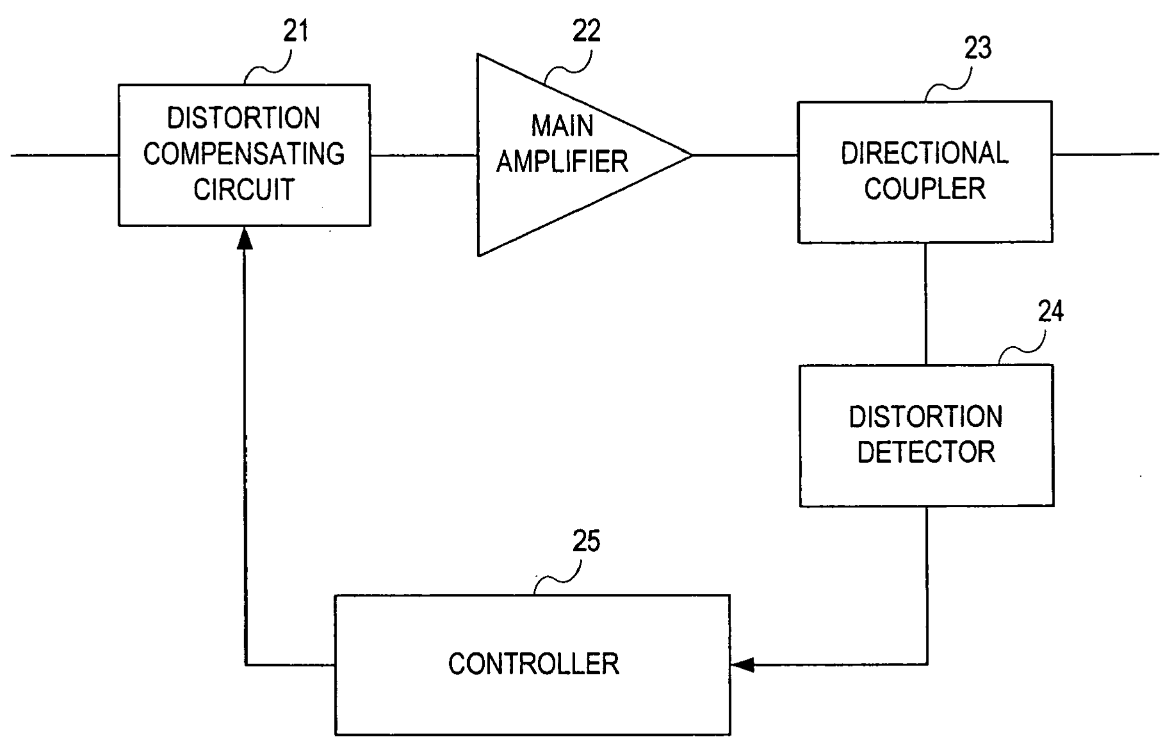
FIG. 11 is a block diagram showing the structure of a related-art distortion compensation amplifier.

A control method for performing more stable distortion compensation in the first to third amplifiers will then be described. The control method is for controlling the first vector controller 2 or/and the second vector controller 6 in the controller 11' of the amplifier shown in FIG. 1, and can be applied to any of the first to third amplifiers. The control method can also be applied to the controller 25 of the amplifier shown in FIG. 11. An application of the amplifier of FIG. 1 will be described herein by way of example.

In the first distortion compensation loop, the controller 11' controls the phase and amplitude in the first vector controller 2 on the basis of the distortion measured by the distortion detector 10 so that the distortion becomes the minimum. In the second distortion compensation loop, the controller 11' controls the phase and amplitude in the second vector controller 6 so that the ACP level from the receiver 13' becomes the minimum.

Figure 7:
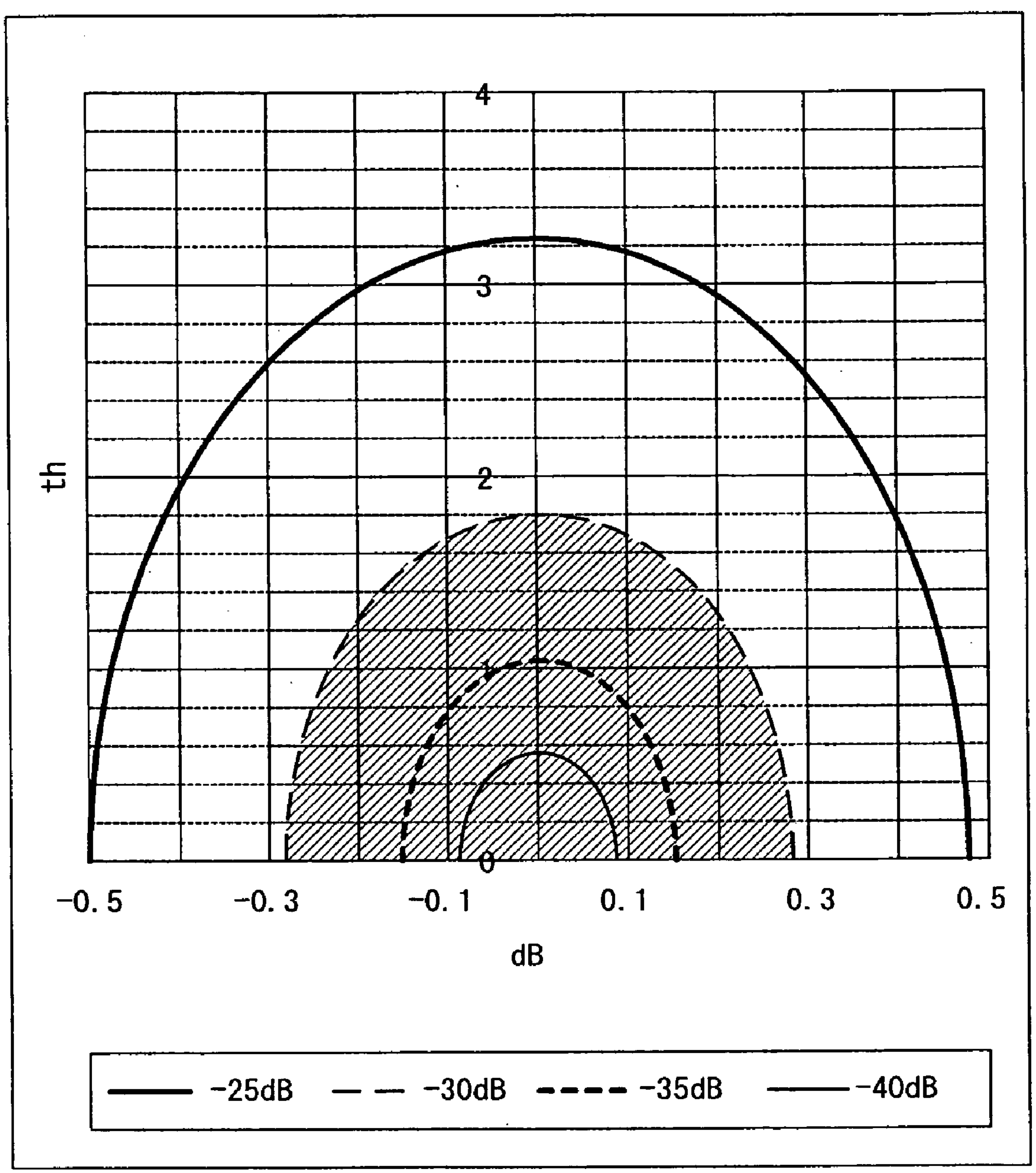
FIG. 7 is a graph showing theoretical suppression values when two sinusoidal signals are added.

Referring to FIG. 7, the suppression when two sinusoidal signals are added will be described. FIG. 7 is a graph showing the theoretical suppression values when two sinusoidal signals are added.

In FIG. 7, a difference in amplitude of two signals combined is plotted in abscissa and a difference in opposite phase of the two signals in ordinate. Here the two signals are a base signal and a distortion compensation signal to be combined by the coupler.

The suppressions in the distortion compensation loops of the feedforward amplifier are the theoretical suppression values shown in FIG. 7. The controller 11' controls the vector controllers 2 and 6 so as to maintain desired improvements.

For example, when a suppression more than 30 dB is required, the amplitude difference and phase difference in the shadowed region in FIG. 7 are needed. The controller 11' controls the vector controllers 2 and 6 on the basis of the amplitude difference and phase difference.

Figure 8:
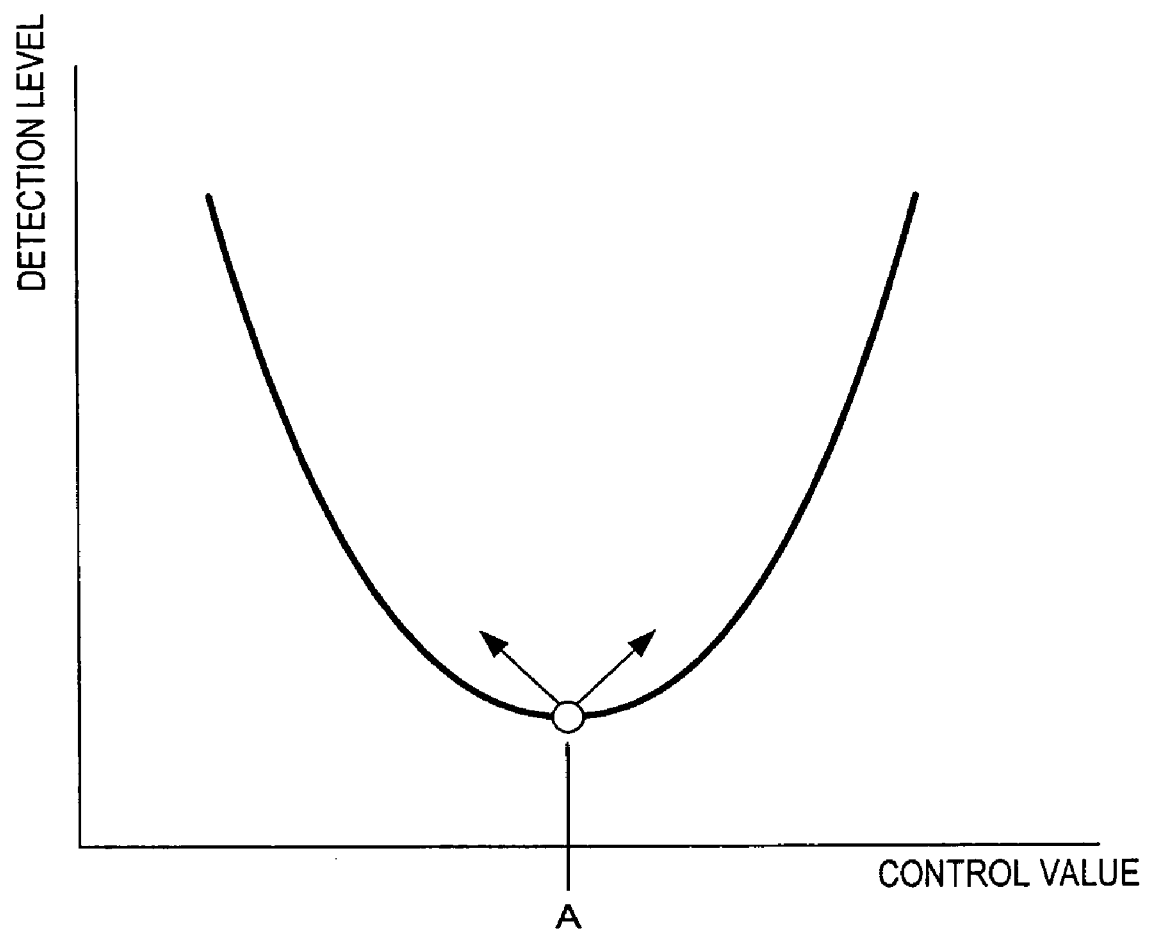
FIG. 8 is a graph showing the relationship between detection levels and control values.

Referring to FIG. 8, the control for obtaining the optimum control values (amplitude and phase) at which the value of the distortion component signal becomes the minimum in the feedforward amplifier will be described. FIG. 8 is a graph showing the relationship between detection levels and control values.

To determine the optimum control values (amplitude and phase) at which the detection value becomes the minimum, a perturbation method is generally used in which a very small value is added to or subtracted from a control value that is set at present into the optimum value. The controller of the feedforward amplifier controls the vector controllers 2 and 6 in the distortion compensation loops until the optimum values at which the detection level becomes the minimum are obtained.

Even if the optimum value A for the control value is obtained at some point in time, it must be continued to determine whether the present control value is the optimum value at this point in time. This needs control for obtaining the optimum value all the time by shifting the control value A to and fro. This brings about a radio characteristic in which the IM (ACP) is moving all the time, taking a lot of time to converge onto the optimum value.

Accordingly, an advantage of the control method according to an embodiment of the invention is to prevent the ACP from becoming unstable, thereby achieving stable control of distortion compensation by setting a threshold for the detection level and, when the detection level becomes less than (or equal or below) the threshold, by stopping the control for the vector controllers 2 and 6 by the controller 11'.

Figure 9:
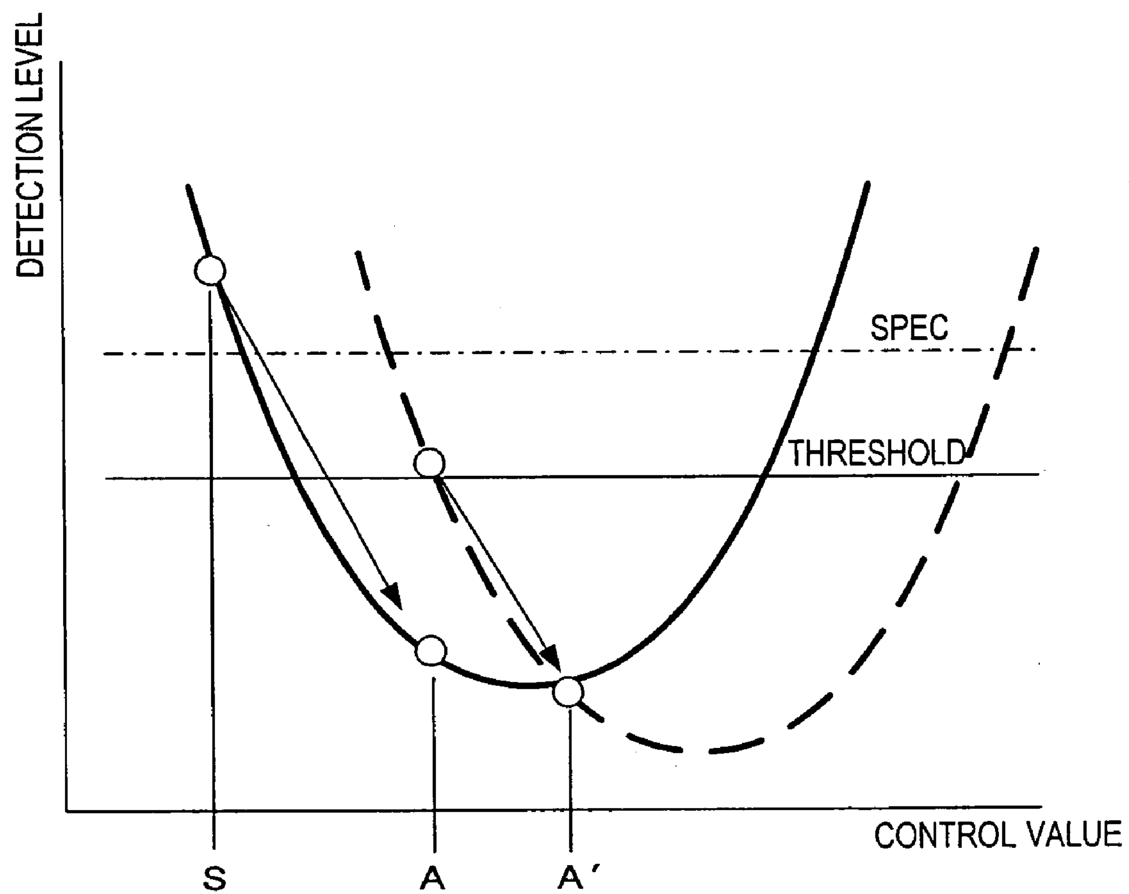
FIG. 9 is a graph showing a first example of the control method of the controller of the amplifier according to the invention.

A first example of the control method will be described with reference to FIG. 9. FIG. 9 is a graph showing the first example of the control method by the controller of the amplifier.

As shown in FIG. 9, the controller 11' sets a threshold at a level lower than a required detection level and retains it in memory. The controller 11' shifts the control value from a control starting position S toward the optimum value by perturbation and, when the detection level becomes lower than the threshold, it stops the perturbation control. In the vector controller, the control value at that time is held.

Thus, in this control method, control that is more than necessary is not performed and as such, the ACP is prevented from becoming unstable and so stable distortion compensation can be achieved. A stable amplifier has a fixed control value A, thus providing stable radio characteristics.

In this control method, although the control is not continued until the detection level becomes the minimum value, the suppressions within the requirement shown in FIG. 7 are satisfied sufficiently, because the threshold is set lower than a required detection level, thereby providing sufficient distortion compensation.

In this control method, even if the curve of the perturbation is shifted by external factors such as temperature and level, the perturbation control is not performed unless the detection level exceeds the threshold. In this case, the detection level varies smoothly according to the external factors.

As indicated by the dotted line in FIG. 9, when the detection level has exceeded the threshold owing to a change in condition, the controller 11' starts the perturbation control again from the control value A, and when it obtains a control value A' at which the detection level becomes less than the threshold, it stops the control. Thus the first example of the control method is executed.

Figure 10:
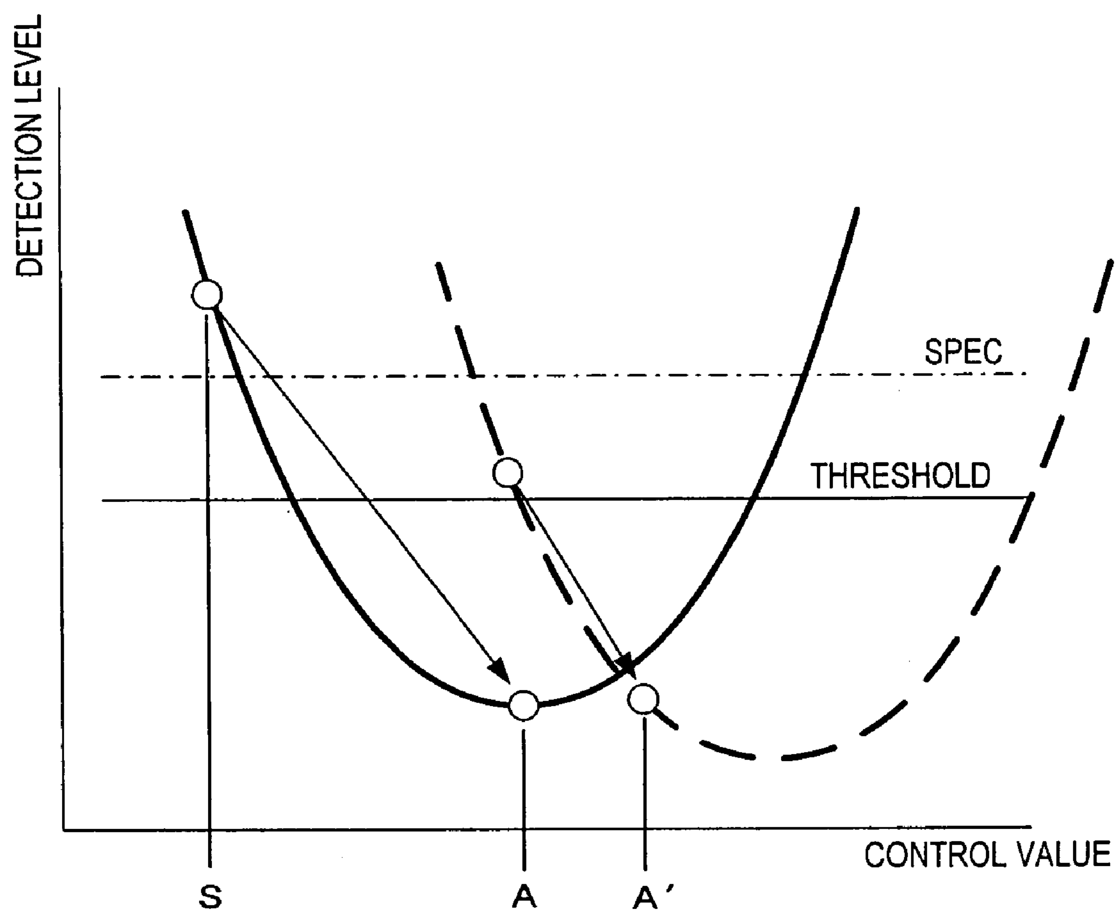
FIG. 10 is a graph showing a second example of the control method of the controller of the amplifier of the invention.

A second example of the control method will be described with reference to FIG. 10. FIG. 10 is a graph showing the second example of the control method by the controller of the amplifier.

As shown in FIG. 10, in the second example of the control method, the controller 11' sets a threshold at a level lower than the required detection level, as in the first example. The controller 11' starts the perturbation control from a control starting position S toward the optimum value A at which the detection level becomes the minimum, where it stops the perturbation control. In the vector controller, the control value at that time is held.

As indicated by the dotted line in FIG. 10, when the detection level has exceeded the threshold owing to a change in condition, the controller 11' starts the perturbation control again from the control value A, and when it obtains a control value A' at which the detection level becomes less than the threshold, it stops the control. Alternatively, it may stop the control after the optimum value has been obtained. Even when the controller 11' continues the control until the optimum value is obtained, once the optimum value is obtained, then the perturbation control is not performed until the detection level exceeds the threshold. Accordingly the ACM hardly becomes unstable as compared with that in continuous control, so that stable distortion compensation can be achieved.

By the control method according to embodiments of the invention, when the controller controls the vector controllers in the distortion compensation loops, the controller sets the threshold lower than a required level as the detection level for the distortion component, and controls the phase and amplitude by perturbation control. When the detection level becomes less than the threshold, the controller stops the control by perturbation to keep the control value at the point in time. Accordingly, this offers the advantage that control that is more than necessary is not performed and as such, the ACP is prevented from becoming unstable and so stable distortion compensation can be achieved.

What is claimed is:

1. A feedforward amplifier that receives a multicarrier signal, the amplifier comprising:

a distortion detection loop in which an input signal is divided into a first route and a second route, wherein in the first route, the phase and amplitude of the input signal are controlled to be amplified, and in the second route, the input signal is delayed, and the signal from the first route is outputted, and the signals outputted from the first and second routes are combined in opposite phase to cancel the fundamental-wave component signals in the input signals and outputted as a distortion component signal;

a distortion compensation loop including a third route and a fourth route, wherein in the third route, the signal outputted from the first route is delayed, and in the fourth route, the phase and amplitude of the distortion component signal are controlled to be amplified, and the signals outputted from the third and fourth routes are combined in opposite phase and outputted as an amplified signal;

a distortion detecting section that measures the level of the distortion component signal in the fourth route;

a receiver that measures the signal level of the adjacent channel leakage power from the amplified signal;

an input monitoring section that monitors the input level of the input signal;

an output monitoring section that monitors the output level of the output signal; and a controller that controls the phase and amplitude of the input signal in the distortion detection loop and/or the phase and amplitude of the distortion component signal in the distortion compensation loop based on the signal level detected by the distortion detecting section and the receiver, and shifts the position of a frequency at which adjacent channel leakage power is detected depending on the level of the inputted signal or the outputted signal and the signal level measured by the receiver.

2. The amplifier according to claim 1, wherein the controller shifts the position of the frequency at which the adjacent channel leakage power is detected to a higher signal level of the receiver in the vicinity of the low frequency or the high frequency of the fundamental-wave component signal depending on the level of the inputted signal or the outputted signal and the signal level measured by the receiver.

3. The amplifier according to claim 1, wherein in the case where the position of the frequency at which the adjacent channel leakage power is detected is set in the vicinity of the low frequency of the fundamental-wave component signal, when the level of the fundamental-wave component signal on the low frequency side decreases to decrease the input level in the input monitoring section, and the signal level of the adjacent channel leakage power which has been received by the receiver is decreased, then the controller shifts the position of the frequency at which the adjacent channel leakage power is detected to the vicinity of high frequencies of the fundamental-wave component signal.

4. The amplifier according to claim 1, wherein in the case where the position of the frequency at which the adjacent channel leakage power is detected is set in the vicinity of the low frequency of the fundamental-wave component signal, when the level of the fundamental-wave component signal on the high frequency side increases to increase the input level in the input monitoring section, and the signal level of the adjacent channel leakage power which has been received by the receiver does not change very much, then the controller shifts the position of the frequency at which the adjacent channel leakage power is detected to the vicinity of high frequencies of the fundamental-wave component signal.

5. The amplifier according to claim 1, wherein the controller retains the signal level of the adjacent channel leakage power in memory and, as a result of shifting the position of the frequency at which the adjacent channel leakage power is detected, compares the signal level of the adjacent channel leakage power after shifting with the signal level of the adjacent channel leakage power before shifting, wherein when the signal level is not increased by a specified amount or more, the controller returns the position of the frequency at which the adjacent channel leakage power is detected to the initial position.

6. The amplifier according to claim 1, wherein in the case where the position of the frequency at which the adjacent channel leakage power is detected is set in the vicinity of the low frequency of the fundamental-wave component signal, when the level of the fundamental-wave component signal on the high frequency side decreases to decrease the input level in the input monitoring section, and the signal level of the adjacent channel leakage power which has been received by the receiver does not change very much, then the controller does not shift the position of the frequency at which the adjacent channel leakage power is detected to keep the position in the vicinity of low frequencies of the fundamental-wave component signal.

7. The amplifier according to claim 1, wherein in the case where the position of the frequency at which the adjacent channel leakage power is detected is set in the vicinity of the low frequency of the fundamental-wave component signal, when the level of the fundamental-wave component signal on the low frequency side increases to increase the input level in the input monitoring section, and the signal level of the adjacent channel leakage power which has been received by the receiver is increased, then the controller does not shift the position of the frequency at which the adjacent channel leakage power is detected to maintain the position in the vicinity of low frequencies of the fundamental-wave component signal.

8. A feedforward amplifier that receives a multicarrier signal, the amplifier comprising:

a distortion detection loop in which an input signal is divided into a first route and a second route, wherein in the first route, the phase and amplitude of the input signal are controlled to be amplified, and in the second route, the input signal is delayed, and the signal from the first route is outputted, and the signals outputted from the first and second routes are combined in opposite phase to cancel the fundamental-wave component signals in the input signals and outputted as a distortion component signal;

a distortion compensation loop including a third route and a fourth route, wherein in the third route, the signal outputted from the first route is delayed, and in the fourth route, the phase and amplitude of the distortion component signal are controlled to be amplified, and the signals outputted from the third and fourth routes are combined in opposite phase and outputted as an amplified signal;

a distortion detecting section that measures the level of the distortion component signal in the fourth route;

a receiver that measures the signal level of the adjacent channel leakage power from the amplified signal;

an input monitoring section that monitors the input level of the input signal;

an output monitoring section that monitors the output level of the output signal; and a controller that controls the phase and amplitude of the input signal in the distortion detection loop and/or the phase and amplitude of the distortion component signal in the distortion compensation loop based on the signal level detected by the distortion detecting section and the receiver, retains the signal level of adjacent channel leakage power in memory, shifts the position of a frequency at which the adjacent channel leakage power is detected at specified intervals, and as a result of the shifting, compares the signal level of the adjacent channel leakage power after shifting with the signal level of the adjacent channel leakage power before shifting, wherein when the signal level is increased by a specified amount or more, maintains the position of the frequency at which the adjacent channel leakage power is detected.

9. The amplifier according to claim 1, wherein the controller sets a threshold of the level of the distortion component signal detected by the distortion detecting section at a level lower than a detection level required by the product specifications and retains the value in memory, and shifts a control value for controlling the phase and amplitude of the input signal in the distortion detection loop from a control starting position to the optimum value by perturbation, wherein when the detection level in the distortion detecting section becomes lower than the threshold, the controller stops the perturbation control.

10. The amplifier according to claim 1, wherein the controller sets a threshold of the signal level of the adjacent channel leakage power detected by the receiver at a level lower than a detection level required by the product specifications and retains the value in memory, and shifts a control value for controlling the phase and amplitude of the distortion component signal in the distortion compensation loop from a control starting position to the optimum value by perturbation, wherein when the detection level in the receiver becomes lower than the threshold, the controller stops the perturbation control.

* * * * *